United States Patent [19]

Chang

[11] 4,246,296
[45] Jan. 20, 1981

[54] CONTROLLING THE PROPERTIES OF NATIVE FILMS USING SELECTIVE GROWTH CHEMISTRY

[75] Inventor: Robert P. H. Chang, Warren, N.J.

[73] Assignee: Bell Telephone Laboratories, Incorporated, Murray Hill, N.J.

[21] Appl. No.: 12,192

[22] Filed: Feb. 14, 1979

[51] Int. Cl.³ .................. H01L 21/30; H01L 21/324; H01L 21/316
[52] U.S. Cl. ..................... 427/38; 204/164; 204/192 S; 427/82; 427/85; 427/87; 427/93; 156/643
[58] Field of Search ................. 427/38.82, 85, 87, 93; 148/1.5; 156/643

[56] References Cited

U.S. PATENT DOCUMENTS

| | | | |
|---|---|---|---|
| 3,287,243 | 11/1966 | Ligenza | 204/192 |
| 3,297,500 | 1/1967 | Drake et al. | 148/174 |
| 3,692,571 | 9/1972 | Colton et al. | 427/93 |
| 3,890,169 | 6/1975 | Schwartz et al. | 148/1.5 |
| 3,907,616 | 9/1975 | Wiemer | 204/164 |
| 3,914,465 | 10/1975 | Dyment et al. | 427/82 |
| 4,062,747 | 12/1977 | Chang et al. | 204/164 |
| 4,144,634 | 3/1979 | Chang et al. | 204/164 |
| 4,170,666 | 10/1979 | Pancholy et al. | 427/82 |
| 4,172,906 | 10/1979 | Pancholy | 427/82 |
| 4,183,780 | 1/1980 | McKenna et al. | 427/38 |

OTHER PUBLICATIONS

Bondur et al., "Ion Implanted Emitters Defined by Plasma Etching," IBM TDB, 18, No. 8, 1-1976.
Ma et al., "Selective Oxidation of Silicon in Oxygen Plasma," IBM TDB, 19, No. 9, 2-1977.
Stirn et al., "Technology of GaAs Metal-Oxide-Semiconductor Solar Cells," IEEE Transactions on Electron Devices, vol. EP-24, No. 4, 4-1977.
Chang, "Some Properties of Plasma-Grown GaAs Oxides," Thin Solid Films, 56, pp.v89-106, 1-1979.

Primary Examiner—John D. Smith
Attorney, Agent, or Firm—Samuel H. Dworetsky

[57] ABSTRACT

An improved technique for growing native films on compound semiconductors is disclosed. In this technique, additional preferential chemistry is used in conjunction with prior art growth processes to eliminate what would otherwise be unreacted constituents in the native film. Films grown using this technique display improved electrical properties.

17 Claims, 2 Drawing Figures

CONTROLLING THE PROPERTIES OF NATIVE FILMS USING SELECTIVE GROWTH CHEMISTRY

BACKGROUND OF THE INVENTION

1. Field of the Invention

This invention involves the growth of native films.

2. Description of the Prior Art

The rapid increase in large scale and very large scale integrated devices has been made possible in large part as a result of improved thin film growth and processing technology. Such films can now be grown and processed on semiconductor substrates with very high resolution. Needless to say, such growth and processing steps must take place without the formation of impurities which would drastically interfere with the electrical properties of the resulting devices. Such undesirable elements may appear in the form of ambient atoms and molecules, or may result from imperfect or incomplete chemistry which may occur during the growth or processing steps.

An initial step in the fabrication of integrated semiconductor devices usually involves the growth of thin films upon a semiconductor substrate. Such films may either be deposited or may be grown from the substrate. The growth of exemplary oxide films, commonly referred to as native oxide films, occurs when the semiconductor substrate is exposed to oxygen bearing compounds which, under the proper electrical, thermal and/or chemical conditions, diffuse through the semiconductor and react with it to form an oxide.

When a film is grown on a compound semiconductor, any deviation from exact stoichiometry or any unreacted constituent (both referred to here generally as "astoichiometry") in the film, or in the interface region between the film and the underlying semiconductor, can have deleterious effects on the electrical performance of the resulting device. Undesirable astoichiometry usually can be traced to the complicated chemistry involved in the growth of the compound semiconductor film. Specifically, each of the various constituents of the compound substrate will most often have different reaction properties for the chemistry utilized during the growth. Consequently, the constituents of the compound semiconductor will not react uniformally and the reacted material will be astoichiometric, e.g., interspersed with unreacted semiconductor constituents. Relevant reaction parameters which might vary, depending on the constituents of the compound semiconductor, include chemical reaction rates, diffusion rates and volitization parameters.

Astoichiometric effects in the growth of native compound semiconductor films may reveal themselves in both the film, and the interface region between the film and the substrate. The effects of such astoichiometry may be exemplified by the interface region which forms when a native gallium arsenide oxide film is grown using the specific plasma oxidation technique described in U.S. Pat. No. 4,062,747. This growth process involves exposing the gallium arsenide oxide substrate to an appropriate plasma, containing oxygen-bearing compounds. It is found that devices grown in this manner may contain excess unreacted arsenic in both the interface region and the film unless specific preventive steps are taken. Such steps are disclosed in U.S. Pat. No. 4,062,747 and in U.S. application Ser. No. 810,771 filed June 28, 1977. Unless the excess arsenic is minimized, large interface state densities result and significant hysteresis appears in the associated C-V curves. The deleterious arsenic is stable even under high $N_2$ temperature anneal. In fact, upon annealing in nitrogen gas, the arsenic interface layer crystalizes into a metallic domain at the interface, thus severely altering the electrical communication between the oxide and semiconductor.

As mentioned above, prior art techniques have been suggested for minimizing any imbalance which might tend to appear in the interface region. Among such preventive steps are annealing in hydrogen at 450 degrees C. Under these conditions, the hydrogen apparently reacts with the oxide and the arsenic layer to essentially eliminate the hysteresis in the C-V curve. However, such annealing also causes the oxide to become leaky, probably because the hydrogen-bearing compounds in the oxide are not good dielectrics. Alternatively, film parameters can be altered by rapid growth (i.e., ~500 A/min), and surface films which act as filters can be advantageously utilized to reduce the arsenic accumulation at the interface. However, these methods have not been successful in simultaneously eliminating the hysteresis in the C-V curves and preventing the oxide from being leaky.

SUMMARY OF THE INVENTION

This invention is a technique for growing semiconductor films with improved bulk and interface properties. The invention envisions growth of the film using any technique known in the art. The invention involves adding to the chemistry of the prior art growth process an element or elements which will react with the otherwise excessive, imbalanced constituents. The preferential reactant diffuses through the film and in an exemplary embodiment reacts preferentially with the excessive element. This reaction may yield volatile compound which may then diffuse out from the interface region either naturally or under the influence of a subsequent annealing step. Ideally, the added reaction should not compete with the film growth, and in this specific embodiment should merely react with those constituents which would otherwise appear in excess in the interface region on the film bulk.

In a specific embodiment, fluorine bearing compounds are added to an $O_2$ plasma environment used in the course of the previously disclosed plasma growth process (U.S. Pat. No. 4,062,747). Under such conditions, the fluorine reacts preferentially with any excess arsenic to yield what is probably arsenic fluoride ($AsF_3$) which partially diffuses out from the structure and which may be additionally removed by high temperature annealing.

DETAILED DESCRIPTION

Figure 1:
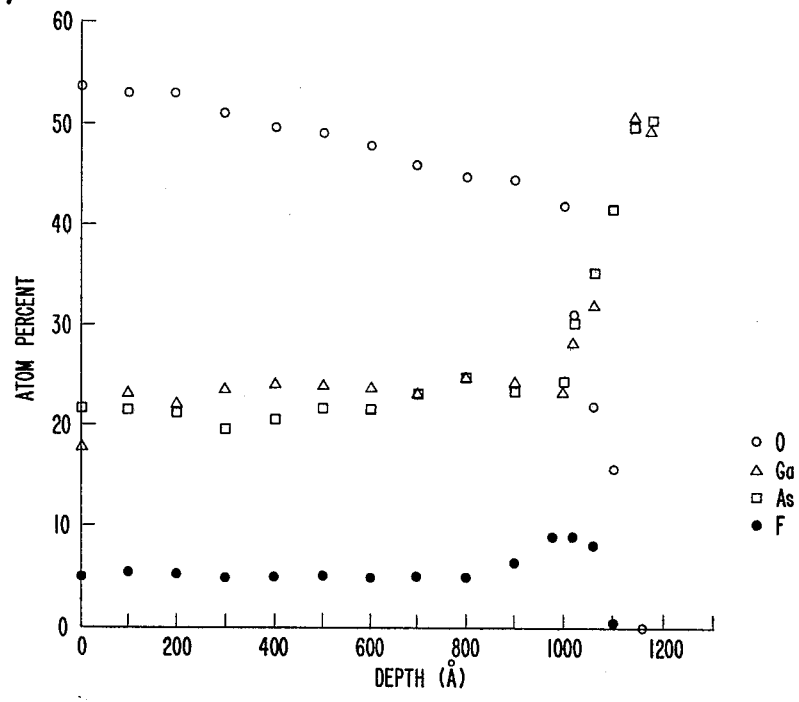
FIG. 1 shows the chemical depth profile of a film grown according to the teaching of a specific embodiment of this invention.

This invention is a technique for growing native films on compound semiconductors. Growth of such films, according to the teachings of this invention, will result in improved electrical properties including an elevated breakdown voltage, yielding a less leaky device, and decreased surface states, interface states and trapping instabilities, yielding minimal hysteresis. In its most generic form, the invention involves including in the film-growth chemistry, elements which will preferentially react with constituents of the compound semiconductor to yield improved stoichiometry in the resultant film, or in the interface region between the film and the semiconductor.

A full appreciation of the invention requires some discussion of the chemistry of film growth and the shortcomings in prior art processes. A typical compound semiconductor is made up of at least two constituents such as in the exemplary III–V semiconductors. Higher order compound semiconductors consist of more than two constituents, such as, for example, gallium aluminum arsenide. (The growth of native films on doped elemental semiconductors such as doped silicon, may also suffer from the limitations to which this invention is addressed, and hence, for the purposes of this application, doped elemental semiconductors are to be included in the term "compound semiconductor".) This invention is addressed to the growth of native films on such compound semiconductors.

A *native* film *is not* deposited. Rather, it results from the exposure of the semiconductor to a reactant or reactants which combine with the substrate itself to form the requisite film. For example, gallium arsenide exposed to oxygen under the proper conditions will form a gallium arsenide oxide film. The oxygen, under the appropriate circumstances, combines with the exemplary gallium arsenide to yield the desired oxide. The invention in its broadest sense is addressed to any such growth process including thermal oxidation, chemical anodization, photochemical oxidation or plasma oxidation. The invention may be applied to the growth of any kind of film including, but not limited to, exemplary oxide and nitride films.

The growth of native films on compound semiconductors, as described above, necessarily involves the reaction of the compound semiconductor constituents with additional elements which together will ultimately form the film. An example, as mentioned above, is the combination of oxygen with gallium arsenide to yield gallium arsenide oxide. Most often, the added element, i.e., the oxygen in the example above, will react at diferent rates with the various constituents of the compound semiconductor. In the above example, oxygen is found to react more rapidly with the gallium than with the arsenic. Likewise, the reacted arsenic is found to be more volatile and to have a higher diffusion coefficient than the reacted gallium. Such differences in the chemistry of the compound semiconductor constituents may result in an excess of unreacted constituent in the film or in the interface between the film and the substrate. In the exemplary gallium arsenide case, it has been shown that an arsenic layer will be formed in the interface region and one to two percent unreacted arsenic will appear in the film bulk. Such astoichiometry, whether in the film or in the interface region, will quite naturally affect the electrical properties of any resultant device. In an exemplary MOS structure, the capacitance in the device may be affected and "floating gates" may additionally result, yielding hysteresis effects. Extended studies have shown that an unreacted layer in the interface region will play a significant role in contributing to the deleterious electrical properties of the resultant electrical device.

Numerous suggestions have been forwarded to limit the astoichiometry and improve the resultant electrical properties. These suggestions have included various annealing steps, as well as the growth of layered structures. Nevertheless, it is still difficult to fabricate a compound semiconductor structure with both good inversion properties and minimal hysteresis effects.

This invention takes an entirely new approach in striving for improved stoichoimetry in the growth of native films. Prior art processes have emphasized chemistry which affects the various constituents of the compound semiconductor uniformly. It was felt that in this manner, the reaction of the constituents would be more uniform, yielding more perfect stoichiometry. Applicants, however, start with the assumption that the chemistry *cannot* be easily balanced. Their approach, and the approach of this invention, is to add *additional preferential* chemistry which will cancel the non-uniform effects of the preferential chemistry inherent in the prior art process. So, for example, if in the growth of gallium arsenide films the chemistry is found to prefer the reaction of oxygen with gallium yielding an arsenic rich layer, as is in fact the case, applicants teach adding exemplary additional chemistry which, while preferential, prefers reaction with the arsenic. In this manner, the total chemistry is balanced, the amount of unreacted constitutent is minimized, and the stoichiometry of the film is further improved.

The invention then envisions the use of any native film growth process which in the prior art is found to prefer reaction with at least one of the constituents of the compound semiconductor. The invention is characterized in the addition to this prior art chemistry of added preferential chemistry which reacts preferentially with at least one of the partially unreacted constituents to remove the astoichiometry.

EXAMPLE

While the invention is applicable to any process capable of growing native films on compound semiconductors, an illustrative embodiment is the plasma growth of oxides on GaAs, as described in U.S. Pat. No. 4,062,747 and U.S. Patent application Ser. No. 810,771 now U.S. Pat. No. 4,144,634. It has been shown that in such growth, arsenic may segregate at the oxideGaAs interface because of the preferential reaction of oxygen with gallium. The arsenic layer creates interface states that are detrimental for certain applications. Thus, it is desirable to either remove this elemental arsenic layer, or transform it into another compound which is not detrimental.

Preferential chemistry was investigated in order to modify the arsenic layer under the above-referenced plasma growth conditions. Oxides were grown using mixtures of $O_2$ and $CF_2$ gases at $CF_4/O_2$ ratios between 0.1 and 3 with background pressures below $10^{-3}$ torr. An exemplary oxygen plasma (density $\sim 10^{10}$ particles/cm$^3$, electron temperature, Te$\sim$4 eV) is formed at a background pressure of $10^{-3}$ torr and an ambient temperature of $\sim$30 degrees C. with a pair of rf electrodes. The electrodes are driven in balance at the same dc potential with a typical rf power of a few hundred watts at a frequency between 20 and 30 mHz. (The plasma can also be easily formed with a set of filaments or an external coil.) The plasma thus formed in the source region of the plasma device is confined by an external magnetic field of a few hundred gauss. (The magnetic confinement is also an effective way of reducing contamination from the chamber walls.) The plasma column is several centimeters in diameter and about a meter long. The sample (e.g., GaAs with <100> orientation and Te doped $\sim 2\times 10^{15}$/cc) may be first polished and cleaned in chemical and etching solution. It is then mounted in a framed sample holder which is immersed in the oxygen plasma such that the wafer surface is at least 30 cm away from the electrodes to avoid sputtering contamination from the plasma generating electrodes, and is normal to the magnetic field lines. The sample holder is usually designed such that the substrate temperature can be maintained and monitored between 0 to 100 degrees C. without rf interference, while the substrate can be biased with respect to the plasma from about 0.2 to five hundred volts. The sample holder itself is usually made of insulating material so as not to disturb the plasma surrounding it.

The plasma thus formed contains a mixture of CF, CO and CFO complexes as well as $O_{x=1-3}$, $F^-$, neutral F and electrons. By biasing the GaAs substrate positively with respect to the plasma, the negatively charged fluorine and oxygen ions are further attracted to the substrate. Depth profiles indicate that under these conditions, the fluorine is incorporated into the resultant oxide film with a distribution as shown in FIG. 1. Infrared analysis indicates the presence of fluorine in the form of $AsF_3$. The fluorine content can be as high as 40 atm percent, but at such concentrations the interface becomes more diffused, the Ga/As ratio increases to values much greater than 1, and the resultant electrical properties are poor. Using the inventive process, fluorine is generally incorporated into the oxide with the amount varying from $9.2\times 10^{15}/cm^2$ in a 1000 A film for 10 percent $CF_4$ in $O_2$, to $3.07\times 10^{17}/cm^2$ in a 2000 A film for 75 percent $CF_4$ in $O_2$. Fluorine concentrations on the order of, or less than, 6 atm percent are shown in FIG. 1.

While depth profile studies indicate an accumulation of fluorine at the GaAs interface, the oxide is otherwise essentially stoichiometric. About 30 percent of the fluorine in the oxide could be removed by high temperature (approximately 450 degrees C.) treatment with this concentration increasing with decreasing fluorine content. At low fluorine concentrations (less than 6 percent), most if not all of the fluorine could be removed by heat treatment. Some fluorine may be desirable, in analogy with a role of chlorine in silicon technology, where it is found that the fluorine is useful for reducing the effects caused by alkaline ions and for passivating interface states. Large amounts of fluorine could be incorporated by increasing the $CF_2$ concentration.

Figure 2:
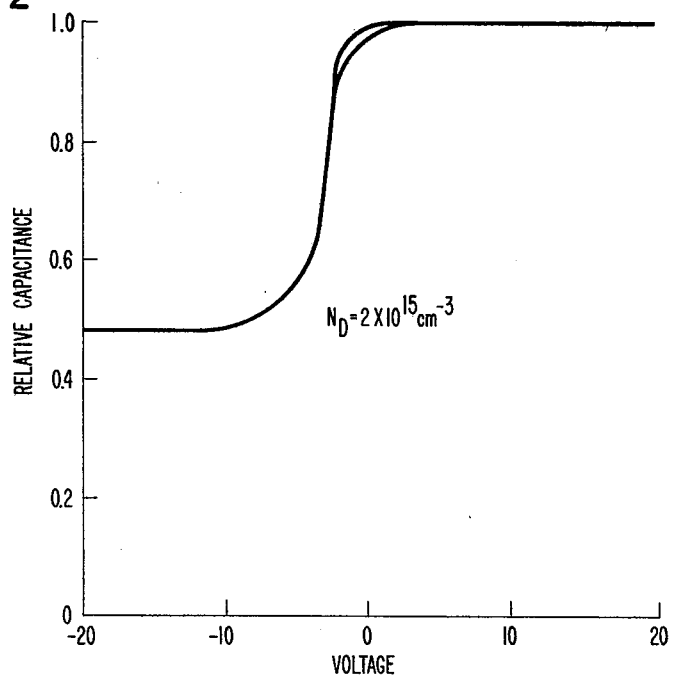
FIG. 2 is a C/V plot for a film grown according to the teachings of a specific embodiment of this invention.

A typical high frequency (1 MHz) C-V curve for a device fabricated according to the teachings of this invention is shown in FIG. 2. The data were obtained from a 1500 A thick oxide grown as above on a vapor phase epitaxial layer of (100) GaAs with $N_D+2\times 10^{15}$/cc. The oxide was selectively grown in a plasma with a $CF_4/O_2=1$ gas mixture and then annealed in a $H_2/N_2=1$ medium at 450 degrees C. for one-half hour. Note that the C-V curve shows essentially no hysteresis, indicating that the selective oxidation process has removed most of the trap states. The C-V curve goes into inversion at negative bias, indicating that the oxide does not leak.

I claim:

1. A method of growing a native film on a compound semiconductor comprising
exposing a compound semiconductor to at least one first reactant which reacts preferentially with at least one of the compound semiconductor constituents to grow a native film, the invention CHARACTERIZED IN THAT the compound semiconductor is additionally exposed to at least one second reactant, which reacts preferentially with at least one compound semiconductor constituent which does not react preferentially with the first reactant, and in that the reactants are introduced into a plasma which comprises a reaction causing environment, thereby yielding a film with improved stoichiometry.

2. The method of claim 1 wherein the first reactant comprises oxygen and the native film thereby grown is an oxide film.

3. The method of claim 2 wherein the plasma is magnetically confined.

4. The method of claim 3 wherein the plasma comprises an oxygen plasma.

5. The method of claim 4 wherein the compound semiconductor is gallium arsenide.

6. The method of claim 5 wherein the second reactant comprises fluorine.

7. The method of claim 6 wherein the second reactant comprises $CF_4$ gas added to the oxygen plasma.

8. The method of claim 7 wherein the $CF_4/O_2$ ratio is between 0.1 and 3.

9. The method of claim 12 wherein subsequent to the native film growth, the film is thermally annealed in an environment comprising hydrogen and nitrogen.

10. The method of claim 3 wherein the second reactant reacts with at least one of the compound semiconductor constituents and becomes incorporated into the resulting film.

11. The method of claim 3 wherein the second reactant preferentially reacts with at least one of the compound semiconductor constituents forming a volatile constituent which subsequently leaves the substrate.

12. A method of growing a native film comprising forming an oxygen plasma at a background pressure of less than $9\times 10^{-3}$ torr using a pair of RF electrodes;
driving the electrodes in approximate balance at the same dc potential, at a power of between 1 and 500 watts and at a frequency of between 20 and 30 mHz;
confining the plasma using an external magnetic field of between 1 and 500 gauss;
directing magnetically the plasma to a semiconductor substrate;
orienting the semiconductor substrate approximately normal to the magnetic field lines;
biasing the semiconductor substrate positive with respect to the plasma; the invention characterized in that fluorine is added to the oxygen plasma, whereby a native oxide film is grown.

13. The method of claim 12 wherein the semiconductor is gallium arsenide.

14. The method of claim 13 wherein the fluorine is added in the form of $CF_4$ gas and the $CF_4/O_2$ ratio is between 0.1 and 3.

15. A method of growing a native oxide layer comprising
placing a semiconductor substrate in an oxygen environment comprising oxygen at a pressure of less than $9\times 10^{-3}$ torr;
directing a beam comprising electrons of density of between $10^8$ electrons/cc and $10^{12}$ electrons/cc toward the substrate; and
biasing the substrate between 0.2 and 500 volts positive with respect to the source of the electrons, the invention characterized in that fluorine is added to the oxygen environment, whereby a native oxide layer is grown.

16. The method of claim 15 wherein the semiconductor is gallium arsenide.

17. The method of claim 16 wherein the fluorine is added in the form of $CF_4$ gas and the $CF_4/O_2$ ratio is between 0.1 and 3.

* * * * *